(12) United States Patent
Aoyagi

(10) Patent No.: US 7,091,619 B2
(45) Date of Patent: Aug. 15, 2006

(54) SEMICONDUCTOR DEVICE, SEMICONDUCTOR PACKAGE, ELECTRONIC DEVICE, ELECTRONIC APPARATUS, AND MANUFACTURING METHODS OF SEMICONDUCTOR DEVICE AND ELECTRONIC DEVICE

(75) Inventor: Akiyoshi Aoyagi, Atsugi (JP)

(73) Assignee: Seiko Epson Corporation, (JP)

( * ) Notice: Subject to any disclaimer, the term of this patent is extended or adjusted under 35 U.S.C. 154(b) by 96 days.

(21) Appl. No.: 10/805,499

(22) Filed: Mar. 19, 2004

(65) Prior Publication Data

US 2004/0222510 A1 Nov. 11, 2004

(30) Foreign Application Priority Data

Mar. 24, 2003 (JP) .............................. 2003-081221

(51) Int. Cl.
*H01L 23/02* (2006.01)
(52) U.S. Cl. ...................... 257/777; 257/686; 257/778; 257/747; 257/775
(58) Field of Classification Search ................ 257/686, 257/691, 738, 775–780, 747; 438/108, 612, 438/613, 638; 228/175–180.2
See application file for complete search history.

(56) References Cited

U.S. PATENT DOCUMENTS

| | | | | |
|---|---|---|---|---|
| 3,871,015 | A * | 3/1975 | Lin et al. ..................... | 257/779 |
| 5,120,678 | A | 6/1992 | Moore et al. | |
| 5,222,014 | A | 6/1993 | Lin | |
| 5,432,358 | A * | 7/1995 | Nelson et al. ................. | 257/81 |
| 5,569,960 | A * | 10/1996 | Kumazawa et al. ......... | 257/738 |
| 5,642,261 | A * | 6/1997 | Bond et al. .................. | 361/704 |
| 5,755,374 | A | 5/1998 | Prigmore | |
| 5,796,169 | A * | 8/1998 | Dockerty et al. ........... | 257/780 |
| 5,834,848 | A | 11/1998 | Iwasaki | |
| 5,940,729 | A * | 8/1999 | Downes et al. ............. | 438/613 |
| 5,973,392 | A | 10/1999 | Senba et al. | |
| 6,020,561 | A * | 2/2000 | Ishida et al. ................. | 174/261 |
| 6,023,097 | A | 2/2000 | Chiang et al. | |
| 6,025,648 | A * | 2/2000 | Takahashi et al. .......... | 257/778 |
| 6,025,650 | A | 2/2000 | Tsuji et al. | |
| 6,034,425 | A | 3/2000 | Chiang et al. | |
| 6,051,878 | A | 4/2000 | Akram et al. | |
| 6,121,689 | A * | 9/2000 | Capote et al. .............. | 257/783 |
| 6,122,171 | A | 9/2000 | Akram et al. | |
| 6,184,586 | B1 * | 2/2001 | Matsushima ................ | 257/780 |
| 6,239,383 | B1 | 5/2001 | Lin | |

(Continued)

FOREIGN PATENT DOCUMENTS

JP 06-013541 1/1994

(Continued)

OTHER PUBLICATIONS

Communication from Japanese Patent Office re: related application.

(Continued)

*Primary Examiner*—Anh D. Mai
*Assistant Examiner*—Brian E. Kunzer
(74) *Attorney, Agent, or Firm*—Harness, Dickey & Pierce, P.L.C.

(57) ABSTRACT

A method is provided to enhance the connection reliability in three-dimensional mounting while considering the warping of packages. Opening diameters of the openings provided corresponding to protruding electrodes, respectively, are set so as to gradually decrease from the central portion toward the outer peripheral portion of a carrier substrate, and the opening diameters of openings provided corresponding to the protruding electrodes, respectively, are set so as to gradually decrease from the central portion toward the outer peripheral portion of another carrier substrate.

14 Claims, 7 Drawing Sheets

U.S. PATENT DOCUMENTS

| | | |
|---|---|---|
| 6,288,445 B1 | 9/2001 | Kimura |
| 6,369,444 B1 | 4/2002 | Degani et al. |
| 6,369,448 B1 | 4/2002 | McCormick |
| 6,396,116 B1 * | 5/2002 | Kelly et al. .................. 257/432 |
| 6,404,049 B1 | 6/2002 | Shibamoto et al. |
| 6,442,026 B1 | 8/2002 | Yamaoka |
| 6,444,563 B1 * | 9/2002 | Potter et al. ................. 438/615 |
| 6,461,881 B1 | 10/2002 | Farnworth et al. |
| 6,489,678 B1 | 12/2002 | Joshi |
| 6,493,229 B1 * | 12/2002 | Akram et al. ................ 361/704 |
| 6,507,098 B1 | 1/2003 | Lo et al. |
| 6,563,712 B1 * | 5/2003 | Akram et al. ................ 361/719 |
| 6,573,119 B1 | 6/2003 | Hirashima et al. |
| 6,586,684 B1 * | 7/2003 | Frutschy et al. ............. 174/260 |
| 6,586,832 B1 | 7/2003 | Shibata et al. |
| 6,611,063 B1 | 8/2003 | Ichinose et al. |
| 6,627,991 B1 | 9/2003 | Joshi |
| 6,633,078 B1 * | 10/2003 | Hamaguchi et al. ........ 257/686 |
| 6,654,250 B1 * | 11/2003 | Alcoe .......................... 361/719 |
| 6,670,264 B1 | 12/2003 | Sakuyama et al. |
| 6,707,161 B1 * | 3/2004 | Moon et al. .................. 257/778 |
| 6,731,009 B1 | 5/2004 | Jones et al. |
| 6,736,306 B1 * | 5/2004 | Byun et al. ............. 228/180.22 |
| 6,750,549 B1 * | 6/2004 | Chandran et al. ........... 257/780 |
| 6,774,467 B1 | 8/2004 | Horiuchi et al. |
| 6,774,473 B1 * | 8/2004 | Shen ........................... 257/686 |
| 6,781,241 B1 | 8/2004 | Nishimura et al. |
| 6,787,916 B1 | 9/2004 | Halahan |
| 6,870,272 B1 * | 3/2005 | Kovac et al. ................ 257/778 |
| 6,882,232 B1 | 4/2005 | Harima |
| 6,903,458 B1 | 6/2005 | Nathan |
| 6,905,911 B1 * | 6/2005 | Hamaguchi et al. ........ 438/107 |
| 2001/0015488 A1 | 8/2001 | Akram et al. |
| 2002/0017709 A1 | 2/2002 | Yanagisawa et al. |
| 2002/0079568 A1 | 6/2002 | Degani et al. |
| 2002/0117330 A1 * | 8/2002 | Eldridge et al. ............. 174/260 |
| 2003/0022465 A1 | 1/2003 | Wachtler |
| 2003/0067064 A1 * | 4/2003 | Kim ............................ 257/686 |
| 2003/0122240 A1 * | 7/2003 | Lin et al. ..................... 257/686 |
| 2004/0135243 A1 | 7/2004 | Aoyagi |
| 2004/0222510 A1 | 11/2004 | Aoyagi |
| 2004/0238954 A1 | 12/2004 | Miyaji et al. |
| 2004/0262368 A1 * | 12/2004 | Haw et al. ................... 228/175 |

FOREIGN PATENT DOCUMENTS

| | | |
|---|---|---|
| JP | 07-183426 | 7/1995 |
| JP | 09-2685 | 4/1997 |
| JP | 09-283697 | 10/1997 |
| JP | 10-084076 | 3/1998 |
| JP | 10-340928 | 12/1998 |
| JP | 11-307717 | 11/1999 |
| JP | 2000-040713 | 2/2000 |
| JP | 2001-015633 | 1/2001 |
| JP | 2001-110979 | 4/2001 |
| JP | 2001-223297 | 8/2001 |
| JP | 2002-057273 | 2/2002 |
| JP | 2002-134661 | 5/2002 |
| JP | 2002-329813 | 11/2002 |
| JP | 2002-353272 | 12/2002 |
| JP | 2004-079923 | 3/2004 |
| JP | 2004-265955 | 9/2004 |
| JP | 2004-273938 | 9/2004 |

OTHER PUBLICATIONS

US 6,120,855, 09/2000, Call et al. (withdrawn)

* cited by examiner

SEMICONDUCTOR DEVICE, SEMICONDUCTOR PACKAGE, ELECTRONIC DEVICE, ELECTRONIC APPARATUS, AND MANUFACTURING METHODS OF SEMICONDUCTOR DEVICE AND ELECTRONIC DEVICE

RELATED APPLICATIONS

This application claims priority to Japanese Patent Application No. 2003-081221 filed Mar. 24, 2003 which is hereby expressly incorporated by reference herein in its entirety.

BACKGROUND

1. Field of the Invention

The present invention relates to a semiconductor device, a semiconductor package, an electronic device, an electronic apparatus, and manufacturing methods of the semiconductor device and the electronic device, and particularly to a layered structure such as the semiconductor package.

2. Description of the Related Art

In a conventional semiconductor device, in order to realize three-dimensional mounting of a semiconductor chip, there has been a method of stacking a package in which the semiconductor chip is mounted through metal balls, as disclosed in Japanese laid-open patent application No. 11-307717.

However, when a semiconductor chip is mounted on a package, a difference in coefficient of linear expansion or the like between the semiconductor chip and the package causes warping. Therefore, the method of stacking packages through metal balls has had a problem in that the warping caused in the package results in non-uniformity in the interval between packages, which deteriorates the joining strength of the metal balls, thereby leading to deterioration of connection reliability in three-dimensional mounting.

Accordingly, an object of the present invention is to provide a semiconductor device, a semiconductor package, an electronic device, and an electronic apparatus capable of enhancing connection reliability in three-dimensional mounting while considering warping of packages, and manufacturing methods of the semiconductor device and the electronic device.

SUMMARY

In order to solve the above-described problem, a semiconductor device according to one embodiment of the present invention comprises: a first semiconductor package, in which a plurality of first joining points are formed, the first joining points having different areas for each of the protruding electrodes; and a second semiconductor package, in which a plurality of second joining points are formed, the second joining points having different areas for each of the protruding electrodes and being arranged so as to be opposed to the respective first joining points.

With this configuration, expansion of the protruding electrodes can be suppressed by both the first joining points and the second joining points, and a thickness of the protruding electrodes joined between the first joining points and the second surfaces can be adjusted. Therefore, even if there is non-uniformity in the interval between the first semiconductor package and the second semiconductor package, constrictions of the protruding electrodes can be suppressed and connection reliability between the first semiconductor package and the second semiconductor package can be enhanced.

According to one embodiment of the semiconductor device of the present invention, the areas of each of the joining points are opening areas of an insulating layer on lands, with which the protruding electrodes are joined. By changing an opening pattern of the insulating layer that is formed on the lands, the areas of the protruding electrodes can be changed, so that the thickness of the protruding electrodes joined between the first joining points and the second joining points can be adjusted without complicating the manufacturing process.

Furthermore, according to one embodiment of the semiconductor device of the present invention, the areas of each of the joining points are gradually changed from a central portion toward an outer peripheral portion of the semiconductor packages. Therefore, even if one or both of the first semiconductor package and the second semiconductor package warp, the protruding electrodes can be joined between the first joining points and the second joining points while suppressing constrictions of the protruding electrodes.

Furthermore, according to one embodiment of the semiconductor device of the present invention, as an interval between the first semiconductor package and the second semiconductor package becomes larger, the areas of the first joining points and the areas of the second joining points gradually become smaller. Therefore, in a region where the interval between the first semiconductor package and the second semiconductor package is large, expansion of the protruding electrodes can be suppressed by both the first joining points and the second joining points, and the protruding electrodes can be rendered thick between the first semiconductor package and the second semiconductor package. Accordingly, even if one or both of the first semiconductor package and the second semiconductor package warp, constrictions of the protruding electrodes between the first semiconductor package and the second semiconductor package can be suppressed and connection reliability between the first semiconductor package and the second semiconductor package can be enhanced.

Furthermore, according to one embodiment of the semiconductor device of the present invention, volumes of each of the protruding electrodes joined to the plurality of joining points are substantially the same. Therefore, even if one or both of the first semiconductor package and the second semiconductor package warp, constrictions of the protruding electrodes can be suppressed without changing the sizes of the protruding electrodes, and connection reliability between the first semiconductor package and the second semiconductor package can be enhanced without deteriorating production efficiency.

A semiconductor device according to one embodiment of the present invention comprises a first semiconductor package, and a second semiconductor package stacked on the first semiconductor package through a plurality of protruding electrodes having different volumes. Therefore, the thickness of the protruding electrodes between the first semiconductor package and the second semiconductor package can be adjusted, and even if there is non-uniformity in the interval between the first semiconductor package and the second semiconductor package, constrictions of the protruding electrodes can be suppressed and connection reliability between the first semiconductor package and the second semiconductor package can be enhanced.

Furthermore, according to one embodiment of the semiconductor device of the present invention, the volumes of the protruding electrodes are gradually changed from a central portion toward an outer peripheral portion of the semiconductor packages. Therefore, even if one or both of the first semiconductor package and the second semiconductor package warp, the first semiconductor package and the second semiconductor package can be connected while suppressing constrictions of the protruding electrodes.

Furthermore, according to one embodiment of the semiconductor device of the present invention, as an interval between the first semiconductor package and the second semiconductor package becomes larger, the volumes of the protruding electrodes gradually become larger. Therefore, in a region where the interval between the first semiconductor package and the second semiconductor package is large, the protruding electrodes between the first semiconductor package and the second semiconductor package can be rendered thick, and even if one or both of the first semiconductor package and the second semiconductor package warp, constrictions of the protruding electrodes between the first semiconductor package and the second semiconductor package can be suppressed.

Furthermore, according to one embodiment of the semiconductor device of the present invention, the amounts of the conductive pastes of the protruding electrodes are different. Therefore, by adjusting the amounts of the conductive pastes, the thickness of the protruding electrodes between the first semiconductor package and the second semiconductor package can be adjusted, and even if there is non-uniformity in the interval between the first semiconductor package and the second semiconductor package, constrictions of the protruding electrodes can be suppressed while suppressing complication of the manufacturing process.

Furthermore, according to one embodiment of the semiconductor device of the present invention, the first semiconductor package comprises: a first carrier substrate; and a first semiconductor chip, flip-chip mounted on the first carrier substrate, and the second semiconductor package comprises: a second carrier substrate, mounted on the first carrier substrate through the protruding electrodes so as to be held above the first semiconductor chip; a second semiconductor chip, mounted on the second carrier substrate; and a sealing material for sealing the second semiconductor chip.

With this configuration, even if the first semiconductor package and the second semiconductor package are different types, the second semiconductor package can be stacked on the first semiconductor package while suppressing an increase in height, and even if there is non-uniformity in the interval between the first semiconductor package and the second semiconductor package, constrictions of the protruding electrodes can be suppressed, so that connection reliability between the first semiconductor package and the second semiconductor package can be enhanced while saving space.

Furthermore, according to one embodiment of the semiconductor device of the present invention, the first semiconductor package is a ball grid array in which the first semiconductor chip is flip-chip mounted on the first carrier substrate, and the second semiconductor package is a ball grid array or a chip-size package, in which the second semiconductor chip mounted on the second carrier substrate is mold-sealed.

Therefore, even if generally-used packages are used, different types of packages can be stacked while suppressing constrictions of the protruding electrodes, so that connection reliability between the different types of packages can be enhanced without deteriorating production efficiency.

Furthermore, an electronic device according to one embodiment of the present invention comprises: a first carrier substrate, in which a plurality of first joining points are formed, the first joining points having different areas for each of the protruding electrodes; a first electronic component, flip-chip mounted on the first carrier substrate; a second carrier substrate, in which a plurality of second joining points are formed, the second joining points having different areas for each of the protruding electrodes and being arranged so as to be opposed to the first joining points; a second electronic component, mounted on the second carrier substrate; and a sealing material for sealing the second electronic component.

With this configuration, the second carrier substrate can be stacked on the first carrier substrate while expansion of the protruding electrodes can be suppressed from both sides of the first carrier substrate and the second carrier substrate. Therefore, the thickness of the protruding electrodes joined between the first joining points and the second joining points can be adjusted while suppressing fluctuations of the areas of each of the joining points, and even if there is large non-uniformity in the interval between the first carrier substrate and the second carrier substrate, constrictions of the protruding electrodes can be suppressed while securing necessary areas of each of the joining points.

Furthermore, an electronic device according to one embodiment of the present invention comprises: a first carrier substrate; a first electronic component, flip-chip mounted on the first carrier substrate; a second carrier substrate, mounted on the first carrier substrate through a plurality of protruding electrodes having different volumes, so as to be held above the first electronic component; a second electronic component, mounted on the second carrier substrate; and a sealing material for sealing the second electronic component.

With this configuration, the second carrier substrate can be stacked on the first carrier substrate while expansion of the protruding electrodes can be suppressed from both sides of the first carrier substrate and the second carrier substrate. Therefore, the thickness of the protruding electrodes joined between the first joining points and the second joining points can be adjusted while suppressing fluctuations of the areas of each of the joining points, and even if there is large non-uniformity in the interval between the first carrier substrate and the second carrier substrate, constrictions of the protruding electrodes can be suppressed while securing the areas of each of the joining points.

Furthermore, according to one embodiment of the semiconductor package of the present invention, areas of joining points of the protruding electrodes joined with one package are changed corresponding to warping of the other package connected to the one package. Therefore, even if the other package warps, expansion of the protruding electrodes can be suppressed on the one package side, so that thickness of the protruding electrodes joined with the one package can be adjusted on the one package side, whereby connection reliability between the packages can be enhanced.

Furthermore, an electronic apparatus according to one embodiment of the present invention comprises: a first semiconductor package, in which a plurality of first joining points are formed, the first joining points having different areas for each of the protruding electrodes; a second semiconductor package, in which a plurality of second joining points are formed, the second joining points having different areas for each of the protruding electrodes and being arranged so as to be opposed to the first joining points; and a motherboard, on which the first semiconductor package is mounted.

By changing the areas of the protruding electrodes, the thickness of the protruding electrodes joined between the first joining points and the second joining points can be adjusted, and even if there is non-uniformity in the interval between the first semiconductor package and the second semiconductor package, constrictions of the protruding electrodes can be suppressed.

Furthermore, an electronic apparatus according to one embodiment of the present invention comprises: a first semiconductor package; a second semiconductor package stacked on the first semiconductor package through a plurality of protruding electrodes having different volumes; and a motherboard, on which the first semiconductor package is mounted.

By changing the volumes of the protruding electrodes, the thickness of the protruding electrodes between the first semiconductor package and the second semiconductor package can be adjusted, and even if there is non-uniformity in the interval between the first semiconductor package and the second semiconductor package, constrictions of the protruding electrodes can be suppressed.

Furthermore, a manufacturing method of a semiconductor device according to one embodiment of the present invention comprises: forming first openings having different opening areas in an insulating layer on first lands provided on a first semiconductor package; forming second openings having different opening areas in an insulating layer on second lands provided on a second semiconductor package; forming protruding electrodes on the second lands, on which the second openings are formed; and stacking the second semiconductor package on the first semiconductor package by joining the protruding electrodes formed on the second lands to the first lands.

With this configuration, areas of the protruding electrodes can be changed and expansion of the protruding electrodes on the lands can be controlled. Therefore, even if one or both of the first semiconductor package and the second semiconductor package warp, the second semiconductor package can be stacked on the first semiconductor package while suppressing constrictions of the protruding electrodes.

Furthermore, a manufacturing method of a semiconductor device according to one embodiment of the present invention comprises: forming conductive materials having different thicknesses on a first semiconductor package by applying the conductive materials via a printing mask having a printing surface whose mask thickness varies; forming protruding electrodes on a second semiconductor package; and stacking the second semiconductor package on the first semiconductor package by joining the protruding electrodes formed on the second semiconductor package with the first semiconductor package via the conductive materials.

By transferring the conductive materials on the first semiconductor package with this method, the thickness of the protruding electrodes between the first semiconductor package and the second semiconductor package can be adjusted, and even if there is non-uniformity in the interval between the first semiconductor package and the second semiconductor package, constrictions of the protruding electrodes can be suppressed while suppressing complication of the manufacturing process.

Furthermore, a manufacturing method of a semiconductor device according to one embodiment of the present invention comprises: forming conductive materials having different thicknesses on a first semiconductor package by controlling to-be-applied amounts of the conductive materials; forming protruding electrodes on a second semiconductor package; and stacking the second semiconductor package on the first semiconductor package by joining the protruding electrodes formed on the second semiconductor package with the first semiconductor package via the conductive materials.

By adjusting to-be-applied amounts of the conductive pastes (materials), the thickness of the protruding electrodes between the first semiconductor package and the second semiconductor package can be adjusted, and even if there is non-uniformity in the interval between the first semiconductor package and the second semiconductor package, constrictions of the protruding electrodes can be suppressed while suppressing complication of the manufacturing process.

Furthermore, a manufacturing method of an electronic device according to one embodiment of the present invention comprises: forming first openings having different opening areas in an insulating layer on first lands provided on a first carrier substrate; mounting a first electronic component on the first carrier substrate; forming second openings having different opening areas in an insulating layer on second lands provided on a second carrier substrate; mounting a second electronic component on the second carrier substrate; forming protruding electrodes on the second lands, on which the second openings are formed; and stacking the second carrier substrate on the first carrier substrate by joining the protruding electrodes formed on the second lands to the first lands.

With this method, the areas of the protruding electrodes can be changed, and even if one or both of the first carrier substrate and the second carrier substrate warp, the second carrier substrate can be stacked on the first carrier substrate while suppressing constrictions of the protruding electrodes.

Furthermore, a manufacturing method of an electronic device according to one embodiment of the present invention comprises: mounting a first electronic component on a first carrier substrate; forming conductive materials having different thicknesses on the first carrier substrate by applying the conductive materials via a printing mask having a printing surface whose mask thickness varies; mounting a second electronic component on a second carrier substrate; forming protruding electrodes on the second carrier substrate, on which the second electronic component is mounted; and stacking the second carrier substrate on the first carrier substrate by joining the protruding electrodes formed on the second carrier substrate with the first carrier substrate via the conductive materials.

By transferring the conductive materials on the first carrier substrate with this method, the thickness of the protruding electrodes between the first carrier substrate and the second carrier substrate can be adjusted, and even if there is non-uniformity in the interval between the first carrier substrate and the second carrier substrate, constrictions of the protruding electrodes can be suppressed while suppressing complication of the manufacturing process.

Furthermore, a manufacturing method of an electronic device according to one embodiment of the present invention comprises: mounting a first electronic component on a first carrier substrate; forming conductive materials having different thicknesses on the first carrier substrate by controlling to-be-applied amounts of the conductive materials; mounting a second electronic component on a second carrier substrate; forming protruding electrodes on the second carrier substrate, on which the second electronic component is mounted; and stacking the second carrier substrate on the first carrier substrate by joining the protruding electrodes formed on the second carrier substrate with the first carrier substrate via the conductive materials.

By adjusting to-be-applied amounts of the conductive pastes (materials), the thickness of the protruding electrodes between the first carrier substrate and the second carrier substrate can be adjusted, and even if there is non-uniformity in the interval between the first carrier substrate and the second carrier substrate, constrictions of the protruding electrodes can be suppressed while suppressing complication of the manufacturing process.

DETAILED DESCRIPTION

Figure 1:
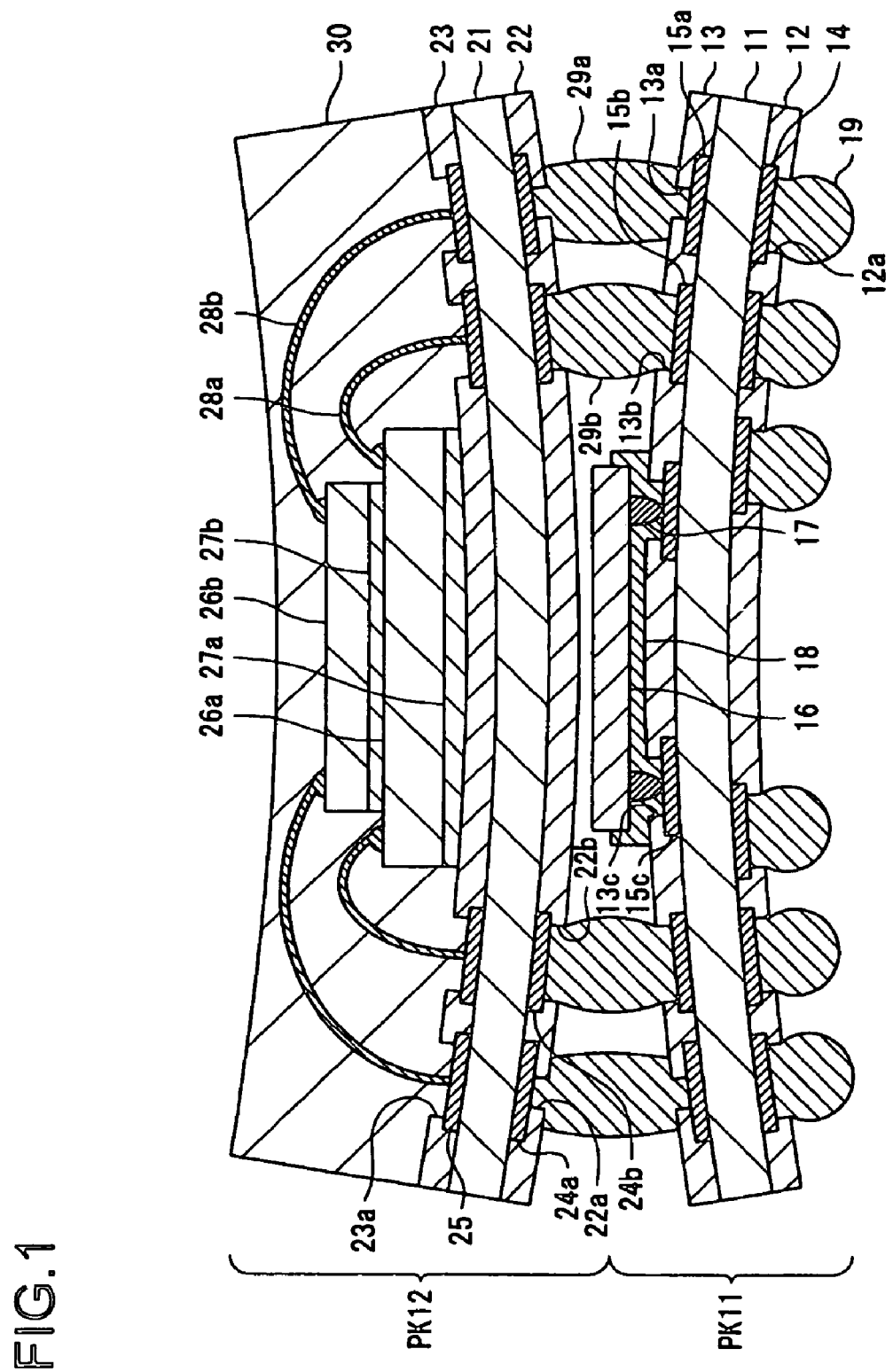
FIG. 1 shows a sectional view illustrating a constitution of a semiconductor device according to a first embodiment.

Hereinafter, a semiconductor device, an electronic device and a manufacturing method of the same according to embodiments of the present invention will be described referring to the drawings. FIG. 1 shows a cross-sectional view illustrating a constitution of a semiconductor device according to a first embodiment of the present invention. In the first embodiment, opening diameters of openings 13a and 13b and openings 22a and 22b for a semiconductor package PK11 and a semiconductor package PK12 respectively, with which protruding electrodes 29a and 29b are joined, are changed.

In FIG. 1, a carrier substrate 11 is provided in the semiconductor package PK11. On a back surface of the carrier substrate 11, lands 14 for arranging protruding electrodes 19 are provided. Furthermore, on the back surface of the carrier substrate 11 provided with the lands 14, an insulating layer 12 such as a solder resist is provided, and openings 12a for exposing surfaces of the lands 14 are provided in the insulating layer 12.

On the other hand, on a front surface of the carrier substrate 11, lands 15a and 15b for arranging the protruding electrodes 29a and 29b, respectively, are provided, and lands 15c for arranging protruding electrodes 17 are provided. Furthermore, on the front surface of the carrier substrate 11 provided with the lands 15a through 15c, an insulating layer 13 such as a solder resist is formed, and the openings 13a through 13c for exposing surfaces of the lands 15a through 15c are provided, respectively, in the insulating layer 13.

The opening diameters of the openings 13a and 13b provided corresponding to the protruding electrodes 29a and 29b, respectively, can be set, for example, so as to be gradually decreased from a central portion toward an outer peripheral portion of the carrier substrate 11. On the carrier substrate 11, a semiconductor chip 16 is flip-chip mounted, and on the semiconductor chip 16, protruding electrodes 17 for flip-chip-mounting are provided. The protruding electrodes 17 provided on the semiconductor chip 16 are ACF (Anisotropic Conductive Film) joined on the lands 15c via an anisotropic conductive film 18. On the lands 14 provided on the back surface of the carrier substrate 11, the protruding electrodes 19 for mounting the carrier substrate 11 on a motherboard are provided.

On the other hand, in the semiconductor package PK12, a carrier substrate 21 is provided. On a back surface of the carrier substrate 21, lands 24a and 24b for arranging the protruding electrodes 29a and 29b, respectively, are provided. Furthermore, on the back surface of the carrier substrate 21 provided with the lands 24a and 24b, an insulating layer 22 such as a solder resist is formed, and the openings 22a and 22b for exposing surfaces of the lands 24a and 24b are provided, respectively, in the insulating layer 22.

The opening diameters of the openings 22a and 22b provided corresponding to the protruding electrodes 29a and 29b, respectively, can be set, for example, so as to be gradually decreased from a central portion toward an outer peripheral portion of the carrier substrate 21. On the other hand, on a front surface of the carrier substrate 11, lands 25 for wire-bonding are provided. On the front surface of the carrier substrate 21 provided with lands 25, an insulating layer 23 such as a solder resist is formed, and openings 23a for exposing surfaces of the lands 25 are provided in the insulating layer 23.

On the carrier substrate 21, a semiconductor chip 26a is face-up-mounted via a joining layer 27a, and the semiconductor chip 26a is wire-bonded to the lands 25 through conductive wires 28a. Furthermore, on the semiconductor chip 26a, a semiconductor chip 26b is face-up-mounted in such a manner as to avoid the conductive wires 28a, and the semiconductor chip 26b is fixed on the semiconductor chip 26a via a joining layer 27b and wire-bonded to the lands 25 through conductive wires 28b. As for the conductive wires 28a and 28b, for example, an Au wire, an Al wire or the like can be used.

Furthermore, on the lands 24a and 24b provided on the back surface of the carrier substrate 21, the protruding electrodes 29a and 29b for mounting the carrier substrate 21 on the carrier substrate 11 are provided, respectively, in such a manner that the carrier substrate 21 is held above the semiconductor chip 16. The protruding electrodes 29a and 29b are arranged in such a manner as to avoid a mounting region of the semiconductor chip 16, and for example, and the protruding electrodes 29a and 29b can be arranged in a peripheral portion of the back surface of the carrier substrate 21.

Furthermore, sealing resin 30 is provided on the whole surface of the carrier substrate 21, which is the mounting side of the semiconductor chips 26a and 26b, and the semiconductor chips 26a and 26b are sealed by the sealing resin 30. In case that the semiconductor chips 26a and 26b are sealed by the sealing resin 30, molding using a thermosetting resin such as an epoxy resin can be employed.

It is assumed that a difference in coefficient of linear expansion between the carrier substrate 11 and the semiconductor chip 16 or the like causes the semiconductor package PK11 to warp downward, and a difference in coefficient of linear expansion between the carrier substrate 21 and the sealing resin 30 or the like causes the semiconductor package PK12 to warp upward. For example, in a state that the semiconductor package PK11 warps downward and the semiconductor package PK12 warps upward, by joining the protruding electrodes 29a and 29b with the lands 15a and 15b provided on the carrier substrate 11, respectively, the carrier substrate 21 can be mounted on the carrier substrate 11.

Both of the opening diameters of the openings 13a and 13b provided corresponding to the lower surfaces of the protruding electrodes 29a and 29b, respectively, and the openings 22a and 22b provided corresponding to the upper surfaces of the protruding electrodes 29a and 29b, respectively, are set so as to be decreased from the central portions toward the outer peripheral portions of the carrier substrates 11 and 21, respectively, and thereby, expansion of the protruding electrodes 29a and 29b can be controlled from both sides of the stacked carrier substrates 11 and 21.

Therefore, thickness of the protruding electrodes 29a and 29b joined between the lands 15a and 15b and the lands 24a and 24b, respectively, can be adjusted while suppressing variation amounts of areas of the protruding electrodes 29a and 29b. Even if the warping of the carrier substrates 11 and 21 is large, constrictions of the protruding electrodes 29a and 29b can be suppressed while the areas that are required for the protruding electrodes 29a and 29b can be secured.

Furthermore, even in case that the carrier substrates 11 and 21 warp, by changing both of the opening diameters of the openings 13a and 13b and the openings 22a and 22b, constrictions of the protruding electrodes 29a and 29b can be suppressed without changing the volumes of the protruding electrodes 29a and 29b. Accordingly, connection reliability between the carrier substrates 11 and 21 can be enhanced while suppressing deterioration of production efficiency when the protruding electrodes 29a and 29b are formed on the carrier substrate 21.

For example, in case that the protruding electrodes 29a and 29b are constituted of solder balls, suppose both ball diameters thereof are set to be the same, that is, to about 0.3 mm and the warping of the carrier substrate 21 is 80 μm. If the opening diameter of the openings 13a and 13b of the carrier substrate 11 are rendered constant at about 0.3 mm and the opening diameter of the openings 24b in the central portion of the carrier substrate 21 are set to about 0.28 mm, a mounting height at the central portion of the carrier substrate 21 is 0.205 mm. In this case, the opening diameter of the openings 24a at an end portion of the carrier substrate 21 needs to be set to about 0.05 mm in order that a mounting height at the end portion of the carrier substrate 21 is 0.285 mm. Therefore, the opening diameter of the openings 24a becomes extremely small and the area of the protruding electrodes 29a and lands 24a becomes too small, thereby leading to a deficiency of the joining strength of the protruding electrodes 29a and the lands 24a.

On the other hand, if the opening diameter of the openings 13a at an end portion of the carrier substrate 11 is set to about 0.28 mm so as to be smaller while maintaining the opening diameter of the openings 13b at a central portion of the carrier substrate 11 at about 0.3 mm, the opening diameter of the openings 24a at the end portion of the carrier substrate 21 may be set to about 0.25 mm in order that the mounting height at the end portion of the carrier substrate 21 is 0.285 mm. Therefore, the opening diameter of the openings 24a is prevented from being too small while a necessary mounting height can be secured.

In addition, as for the carrier substrates 11 and 21, for example, a double-sided substrate, a multilayer-interconnection substrate, a build-up substrate, a tape substrate, or a film substrate or the like can be used. As for the material of the carrier substrates 11 and 21, for example, a polyimide resin, a glass epoxy resin, BT resin, a composite of aramid and epoxy, or a ceramic or the like can be used. Moreover, as for the protruding electrodes 16, 19, 29a, and 29b, for example, Au bump, Cu bump and Ni bump covered with a solder material or the like, or a solder ball can be used. In particular, for the protruding electrodes 29a and 29b, a solder ball, conductive paste or the like is preferably used. Furthermore, although the method of providing the protruding electrodes 29a and 29b on the side of the carrier substrate 21 in order to mount the carrier substrate 21 on the carrier substrate 11 is described, the protruding electrodes 29a and 29b may be provided on the side of the carrier substrate 11.

Furthermore, although in the above-described embodiment, the method of mounting the semiconductor chip 16 on the carrier substrate 11 by ACF joining is described, for example, other pressure-welding joining such as ACF joining, NCF (Nonconductive Film) joining, ACP (Anisotropic Conductive Paste) joining, and NCP (Nonconductive Paste) joining may be used, and metal joining such as solder joining and alloy joining may also be used. In case that the semiconductor chips 26a and 26b are mounted on the carrier substrate 21, although the method of using wire-bonding is described, the semiconductor chips 26a and 26b may be flip-chip mounted on the carrier substrate 21. Furthermore, although in the above-described embodiment, the method of mounting one semiconductor chip 16 on the carrier substrate 11 is described as an example, a plurality of semiconductor chips may be mounted on the carrier substrate 11. Still further, a resin may be injected into a gap between the carrier substrates 11 and 21 as required. In addition, although in the above-described embodiment, an example of face-down-mounting of the semiconductor chip 16 on the carrier substrate 11 is described, it may be face-up-mounted (not shown). In this case, the semiconductor chip 16 may be sealed. Furthermore, in this case, the shape of a portion of the carrier substrate 11 where the semiconductor chip 16 is sealed is modified into a downward convex shape and the shape of a portion where the semiconductor chip is not sealed is modified into an upward convex shape.

Furthermore, although in the above-described embodiment, a case that the lower carrier substrate 11 warps downward and the upper carrier substrate 21 warps upward is described as an example, the embodiment can be similarly applied to a case that the lower carrier substrate 11 does not warp and the upper carrier substrate 21 warps upward, a case that the upper carrier substrate 21 does not warp and the lower carrier substrate 11 warps downward, a case that both of the carrier substrates 11 and 21 warp downward and the lower carrier substrate 11 warps more largely, and a case that both of the carrier substrate 11 and 21 warp upward and the upper carrier substrate 21 warps more largely.

Furthermore, the embodiment may be applied to a case that the lower carrier substrate 11 warps upward and the upper carrier substrate 21 warps downward, a case that the lower carrier substrate 11 does not warp and the upper carrier substrate 21 warps downward, a case that the upper carrier substrate 21 does not warp and the lower carrier substrate 11 warps upward, a case that both of the carrier substrates 11 and 21 warp downward and the upper carrier substrate 11 warps more largely, and a case that both of the carrier substrates 11 and 21 warp upward and the lower carrier substrate 21 warps more largely. In these cases, both of the opening diameters of the openings 13a and 13b provided corresponding to the lower surfaces of the protruding electrodes 29a and 29b, respectively, and the openings 22a and 22b provided corresponding to the upper surfaces of the protruding electrodes 29a and 29b, respectively are preferably set so as to be increased from the central portions to the peripheral portions of the carrier substrates 11 and 21, respectively.

Figure 2A:
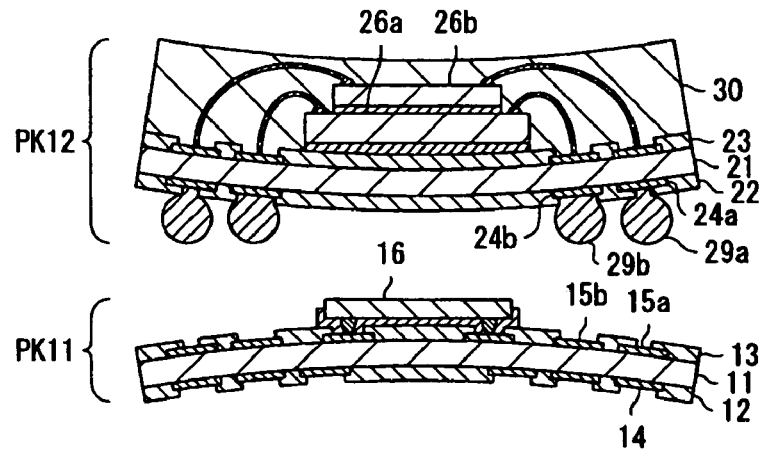
FIGS. 2A–C show sectional views illustrating a manufacturing method of the semiconductor device of FIG. 1.
Figure 2B:
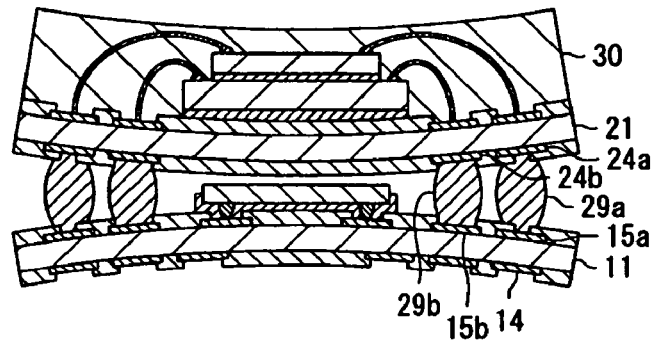
Figure 2C:
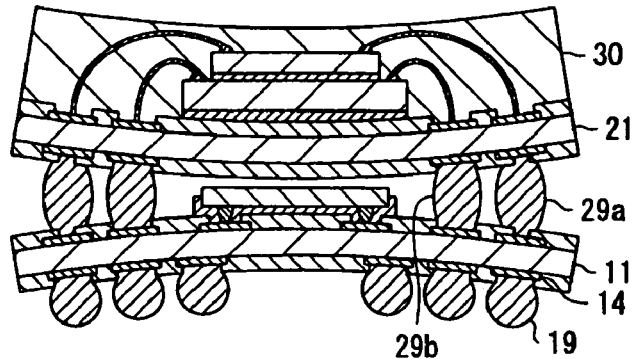

FIGS. 2A–C show cross-sectional views illustrating a manufacturing method of the semiconductor of FIG. 1. In FIG. 2(a), the semiconductor package PK11 warps downward and the semiconductor package PK12 warps upward. In case that the semiconductor package PK12 is stacked on the semiconductor package PK11, the protruding electrodes 29a and 29b are formed on the lands 24a and 24b of the carrier substrate 22, respectively. In case that solder balls are used for the protruding electrodes 29a and 29b, for example, diameters of the balls can be set to substantially the same (that is, within a range of a manufacturing variance).

Next, as shown in FIG. 2(b), the semiconductor package PK12 with the protruding electrodes 29a and 29b formed is mounted on the semiconductor package PK11 and subjected to reflow process to join the electrodes 29a and 29b with the lands 15a and 15b, and the lands 24a and 24b, respectively. By setting both of the opening diameters of the openings 13a and 13b provided corresponding to the lower surfaces of the protruding electrodes 29a and 29b, and the openings 22a and 22b provided corresponding to the upper surfaces of the protruding electrodes 29a and 29b so as to be decreased from the central portions to the peripheral portions of the carrier substrates 11 and 21, even if the solder ball having the same diameters are used as the protruding electrodes 29a and 29b, the mounting height of the carrier substrate 21 can be matched with the warping of the carrier substrates 11 and 21 while suppressing constrictions of the protruding electrodes 29a and 29b.

Next, as shown in FIG. 2(c), the protruding electrodes 19 for mounting the carrier substrate 11 on the motherboard are formed on the lands 14 provided on the back surface of the carrier substrate 11.

Figure 3:
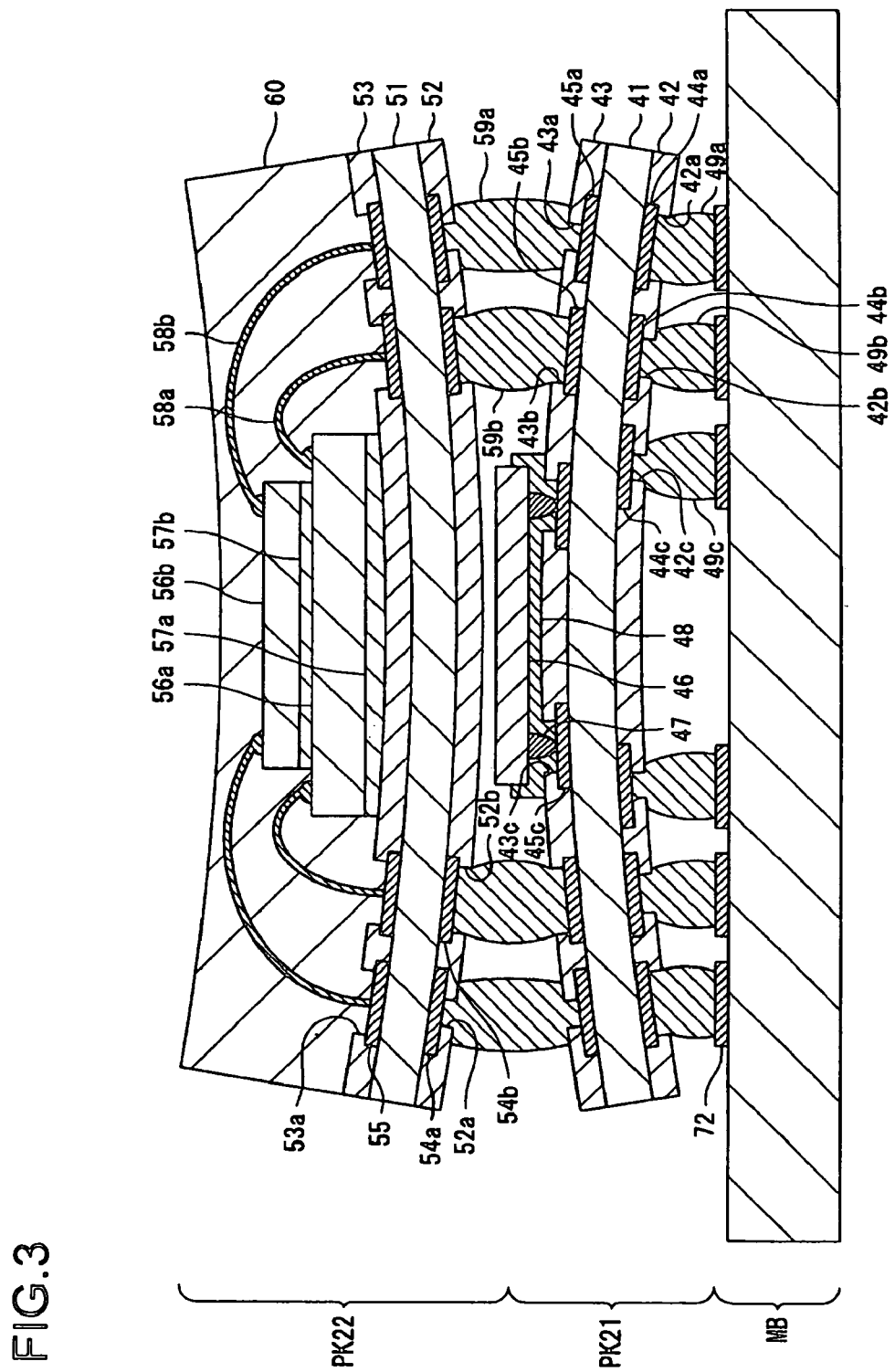
FIG. 3 shows a sectional view illustrating a constitution of a semiconductor device according to a second embodiment.

FIG. 3 shows a cross-sectional view illustrating a constitution of a semiconductor device according to a second embodiment of the present invention. In the second embodiment, opening diameters of openings 43a and 43b and openings 52a and 52b of semiconductor packages PK21 and PK22, with which protruding electrodes 59a and 59b are joined, are changed, respectively, and opening diameters of openings 42a through 42c of the semiconductor package PK21, with which protruding electrodes 49a to 49c are joined, are changed.

In FIG. 3, a carrier substrate 41 is provided in the semiconductor package PK21. On a back surface of the carrier substrate 41, lands 44a through 44c for arranging the protruding electrodes 49a through 49c are provided. Furthermore, on the back surface of the carrier substrate 41 provided with the lands 44a through 44c, an insulating layer 42 such as a solder resist is provided, and the openings 42a through 42c for exposing surfaces of the lands 44a through 44c are provided in the insulating layer 42.

The opening diameters of the openings 42a through 44c provided corresponding to the protruding electrodes 49a through 49c, respectively, can be set, for example, so as to be gradually increased from a central portion toward an outer peripheral portion of the carrier substrate 41. On the other hand, on a front surface of the carrier substrate 41, lands 45a and 45b for arranging the protruding electrodes 59a and 59b are provided, respectively, and lands 45c for arranging protruding electrodes 47 are provided. Furthermore, on the front surface of the carrier substrate 41 provided with the lands 45a, 45b and 45c, an insulating layer 43 such as a solder resist is formed, and the openings 43a through 43c for exposing surfaces of the lands 45a through 45c are provided, respectively, in the insulating layer 43.

The opening diameters of the openings 43a through 43b provided corresponding to the protruding electrodes 59a through 59b, respectively, can be set, for example, so as to be gradually decreased from the central portion toward the outer peripheral portion of the carrier substrate 41. On the carrier substrate 41, a semiconductor chip 46 is flip-chip mounted, and on the semiconductor chip 46, protruding electrodes 47 for the flip-chip-mounting are provided. The protruding electrodes 47 provided on the semiconductor chip 43 are ACF joined on the lands 45c via an anisotropic conductive film 48. On the lands 44a through 44c provided on the back surface of the carrier substrate 41, the protruding electrodes 49a through 49c for mounting the carrier substrate 41 on a motherboard 71 are provided.

On the other hand, in the semiconductor package PK22, a carrier substrate 51 is provided. On a back surface of the carrier substrate 51, lands 54a and 54b for arranging the protruding electrodes 59a and 59b are provided, respectively. Furthermore, on the back surface of the carrier substrate 51 provided with the lands 54a and 54b, an insulating layer 52 such as a solder resist is formed, and the openings 52a and 52b for exposing surfaces of the lands 54a and 54b are provided, respectively, in the insulating layer 52.

The opening diameters of the openings 52a and 52b provided corresponding to the protruding electrodes 59a and 59b, respectively, can be set, for example, so as to be gradually decreased from a central portion toward an outer peripheral portion of the carrier substrate 51. On the other hand, on a front surface of the carrier substrate 51, lands 55 for wire-bonding are provided. On the front surface of the carrier substrate 51 provided with lands 55, an insulating layer 53 such as a solder resist is formed, and openings 53a for exposing surfaces of the lands 55 are provided in the insulating layer 53.

On the carrier substrate 51, a semiconductor chip 56a is face-up-mounted via a joining layer 57a, and the semiconductor chip 56a is wire-bonded to the lands 55 via conductive wires 58a. Furthermore, on the semiconductor chip 56a, a semiconductor chip 56b is face-up-mounted in such a manner as to avoid the conductive wires 58a, and the semiconductor chip 56b is fixed on the semiconductor chip 56a via a joining layer 57b and wire-bonded to the lands 55 through conductive wires 58b.

Furthermore, on the lands 54a and 54b provided on the back surface of the carrier substrate 51, the protruding electrodes 59a and 59b are provided for mounting the carrier substrate 51 on the carrier substrate 41 in such a manner that the carrier substrate 51 is held above the semiconductor chip 46. The protruding electrodes 59a and 59b are arranged in such a manner as to avoid a mounting region of the semiconductor 46, and for example, the protruding electrodes 59a and 59b can be arranged in a peripheral portion of the back surface of the carrier substrate 51.

Furthermore, sealing resin 60 is provided on the whole surface of the carrier substrate 51, which is the mounting side of the semiconductor chips 56a and 56b, and the semiconductor chips 56a and 56b are sealed by the sealing resin 60. It is assumed that a difference in coefficient of linear expansion between the carrier substrate 41 and the semiconductor chip 46 or the like causes, for example, the semiconductor package PK21 to warp downward, and a difference in coefficient of linear expansion between the carrier substrate 51 and the sealing resin 60 or the like causes the semiconductor package PK22 to warp upward.

For example, in the state that the semiconductor package PK21 warps downward and the semiconductor package PK22 warps upward, by joining the protruding electrodes 59a and 59b with the lands 45a and 45b provided on the carrier substrate 41, respectively, the carrier substrate 51 can be mounted on the carrier substrate 41. Furthermore, by joining the protruding electrodes 49a through 49c with lands 72 provided on the motherboard 71, the carrier substrate 11 with the carrier substrate 21 stacked can be mounted on the motherboard 71.

Both of the opening diameters of the openings 43a and 43b provided corresponding to the lower surfaces of the protruding electrodes 59a and 59b, respectively, and the openings 52a and 52b provided corresponding to the upper surfaces of the protruding electrodes 59a and 59b, respectively, are set so as to be decreased from the central portions toward the outer peripheral portions of the carrier substrates 41 and 51, respectively, and thereby, expansion of the protruding electrodes 59a and 59b can be controlled from both sides of the stacked carrier substrates 41 and 51.

Therefore, thickness of the protruding electrodes 59a and 59b joined between the lands 45a and 45b and the lands 54a and 54b, respectively, can be adjusted while suppressing variation amount of areas of the protruding electrodes 59a and 59b. Even in case that the warping of the carrier substrates 41 and 51 is large, constrictions of the protruding electrodes 59a and 59b can be suppressed while the areas that are required for the protruding electrodes 59a and 59b can be secured.

Furthermore, in the carrier substrate 41 interposed between the carrier substrate 51 and the motherboard 71, even in case that the carrier substrate 41 warps, by changing not only the opening diameters of the openings 43a and 43b provided in the one surface but also the diameters of the openings 42a and 42b provided in the other surface, not only constrictions of the protruding electrodes 59a and 59b joined with the carrier substrate 51 but also constrictions of the protruding electrodes 49a through 49c joined with the motherboard 71 can be suppressed. Accordingly, not only connection reliability between the carrier substrate 41 and the carrier substrate 51 can be enhanced but also connection reliability between the carrier substrate 41 and the motherboard 71 can be enhanced.

In addition, as for the carrier substrates 41 and 51 and the motherboard 71, for example, a double-sided substrate, a multilayer-interconnection substrate, a build-up substrate, a tape substrate, or a film substrate or the like can be used. As for the material of the carrier substrates 41 and 51 and the motherboard 71, for example, a polyimide resin, a glass epoxy resin, BT resin, a composite of aramid and epoxy, or a ceramic or the like can be used. Moreover, as for the protruding electrodes 46, 49a through 49c, 59a and 59b, for example, Au bump, Cu bump and Ni bump covered with a solder material or the like, or a solder ball can be used. In particular, for the protruding electrodes 49a through 49c, 59a and 59b, a solder ball, conductive paste or the like is preferably used. Furthermore, although in the above-described embodiment, a case that the lower carrier substrate 41 warps downward and the upper carrier substrate 51 warps upward is described as an example, the embodiment can be similarly applied to a case that the upper carrier substrate 51 does not warp and the lower carrier substrate 41 warps downward, and a case that both of the carrier substrates 41 and 51 warp downward and the lower carrier substrate 41 warps more largely.

Furthermore, in case that the lower carrier substrate 41 warps upward, with or without warping of the upper carrier substrate 51, the opening diameters of the openings 42a through 44c provided corresponding to the protruding electrodes 49a through 49c, respectively, can be set so as to be gradually decreased from the central portion toward the outer peripheral portion of the carrier substrate 41.

FIGS. 4A–C and FIGS. 5A–B show cross-sectional views illustrating a manufacturing method of a semiconductor device according to a third embodiment of the present invention. In the third embodiment, by changing a mask thickness of a printing mask 111, thickness of conductive pastes 89a and 89b printed on a carrier substrate 81 are adjusted.

In FIG. 4, a carrier substrate 81 is provided in a semiconductor package PK31. On a back surface of the carrier substrate 81, lands 84 for arranging protruding electrodes 102 of FIG. 5(b) are provided. Furthermore, on the back surface of the carrier substrate 11 provided with the lands 84, an insulating layer 82 is provided, and openings 82a for exposing surfaces of the lands 84 are provided the insulating layer 82.

Figure 5A:
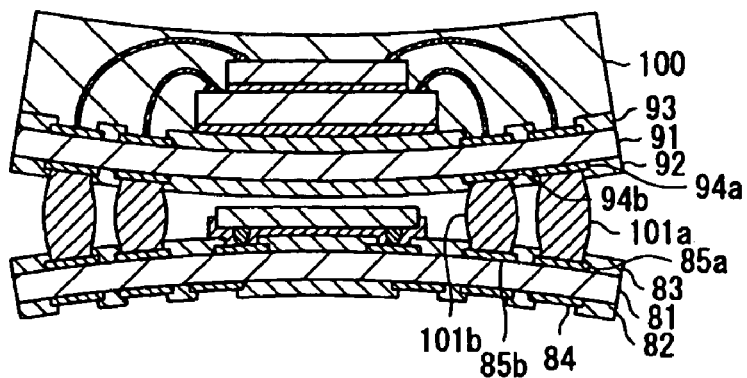
FIGS. 5A–B show sectional views illustrating a manufacturing method of the semiconductor device according to a third embodiment.

On the other hand, on a front surface of the carrier substrate 81, lands 85a and 85b for joining protruding electrodes 101a and 101b of FIG. 5(a) are provided, respectively, and lands 85c for arranging protruding electrodes 87 are provided. Furthermore, on the front surface of the carrier substrate 81 provided with the lands 85a through 85c, an insulating layer 83 is formed, and openings 83a through 83c for exposing surfaces of the lands 85a through 85c are provided, respectively, in the insulating layer 83. Opening diameters of the openings 83a through 83c can be set so as to be substantially the same.

On the carrier substrate 81, a semiconductor chip 86 is flip-chip mounted, and on the semiconductor chip 86, protruding electrodes 87 for flip-chip-mounting are provided. The protruding electrodes 87 provided on the semiconductor chip 86 are ACF joined on the lands 85c via an anisotropic conductive film 88. On the other hand, in a semiconductor package PK32, a carrier substrate 91 is provided. On a back surface of the carrier substrate 91, lands 94a and 94b for arranging protruding electrodes 99a and 99b are provided, respectively. Furthermore, on the back surface of the carrier substrate 91 provided with the lands 94a and 94b, an insulating layer 92 is provided, and openings 92a and 92b for exposing surfaces of the lands 94a and 94b are provided, respectively, in the insulating layer 92. Opening diameters of the openings 92a and 92b can be set so as to be substantially the same.

On the other hand, on a front surface of the carrier substrate 91, lands 95 for wire-bonding are provided. On the front surface of the carrier substrate 91 provided with the lands 95, an insulating layer 93 is formed, and openings 93a for exposing surfaces of the lands 95 are provided in the insulating layer 93. On the carrier substrate 91, a semiconductor chip 96a is face-up-mounted via a joining layer 97a, and the semiconductor chip 96a is wire-bonded to the lands 95 through conductive wires 98a. Furthermore, on the semiconductor chip 96a, a semiconductor chip 96b is face-up-mounted in such a manner as to avoid the conductive wires 98a, and the semiconductor chip 96b is fixed on the semiconductor chip 96a via a joining layer 97b and wire-bonded to the lands 95 through conductive wires 98b.

Furthermore, on the lands 94a and 94b provided on the back surface of the carrier substrate 91, the protruding electrodes 99a and 99b are provided for mounting the carrier substrate 91 on the carrier substrate 81 in such a manner that the carrier substrate 91 is held above the semiconductor chip 86. Furthermore, sealing resin 100 is provided on the whole surface of the carrier substrate 91, which is the mounting side of the semiconductor chips 96a and 96b, and the semiconductor chips 96a and 96b are sealed by the sealing resin 100.

On the other hand, openings 113a and 113b for charging conductive pastes 89 are provided in the printing mask 111, and an opening 112, in which the semiconductor chip 86 can be inserted, is provided on the side of a transfer surface of the printing mask 111. The mask thickness of the printing mask 111 can be set so as to be changed according to positions of the openings 113a and 113b, for example, so as to be gradually increased from a central portion toward an outer peripheral portion of the printing mask 111.

For example, in case that the mask thickness of the printing mask 111 is changed, a cross-sectional shape of the printing mask 111 on the transfer surface side can be an arch while keeping a cross-sectional shape of an upper surface of the printing mask 111 flat. It is assumed that the semiconductor package PK31 warps downward and the semiconductor package PK32 warps upward. In case that the semiconductor package PK32 is stacked on the semiconductor package PK31, the conductive pastes 89 are supplied on the upper surface of the printing mask 111. After charging the conductive pastes 89 to the openings 113a and 113b of the printing mask 111, respectively, the carrier substrate 81 is pressed to the printing mask 111. Furthermore, by moving a squeegee 114 on the printing mask 111 to which the conductive pastes 89 are supplied, the conductive pastes 89 are charged to the openings 113a and 113b. By gradually increasing the mask thickness from the central portion toward the outer peripheral portion of the printing mask 111, a charging amount of the openings 113a arranged in the end portion can be larger than that of the openings 113b arranged in the central portion.

Figure 4A:
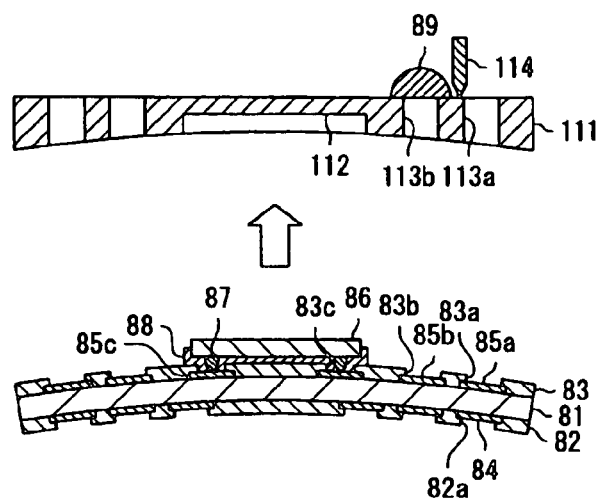
FIGS. 4A–C show sectional views illustrating a manufacturing method of a semiconductor device according to a third embodiment.
Figure 4B:
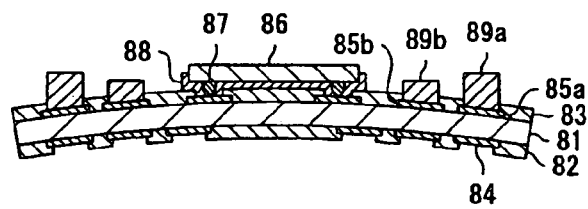
Figure 5B:
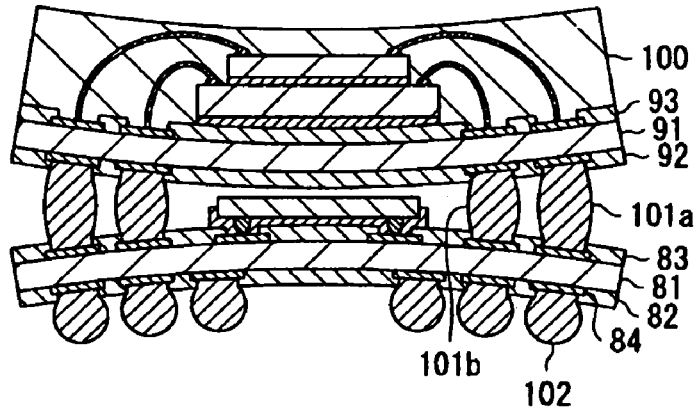

As shown in FIG. 4(b), the conductive pastes 89 charged to the openings 113a and 113b of the printing mask 111 are transferred on the lands 85a and 85b of the carrier substrate 81 to print the conductive pastes 89a and 89b on the lands 85a and 85b of the carrier substrate 81, respectively. The charging amount of the conductive pastes 89 charged in the openings 113a is larger than that of the conductive pastes 89 charged in the openings 113b. Therefore, a thickness of the conductive pastes 89a of the lands 85a of the carrier substrate 81 can be larger than that of the conductive pastes 89b on the lands 85b.

Figure 4C:
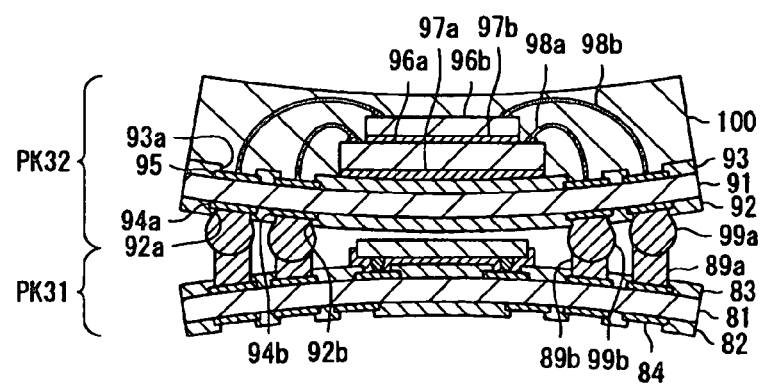

Next, as shown in FIG. 4(c), the semiconductor package PK32, in which the protruding electrodes 99a and 99b are formed, is mounted on the semiconductor package PK31, on which the conductive pastes 89a and 89b are printed. Next, as shown in FIG. 5(a), the conductive pastes 89a and 89b and the protruding electrodes 99a and 99b are melted by reflow process. In this manner, the protruding electrodes 101a and 101b made of the conductive pastes 89a and 89b and the protruding electrodes 99a and 99b are joined onto the lands 85a and 85b and the lands 94a and 94b, respectively.

This enables the conductive pastes 89a and 89b to be integrally formed on the lands 85a and 85b of the carrier substrate 81 while volumes of the protruding electrodes 101a and 101b can be changed corresponding to an interval between the carrier substrate 81 and the carrier substrate 91. Accordingly, even if the carrier substrates 81 and 91 warp, constrictions of the protruding electrodes 101a and 101b can be suppressed, and connection reliability between the carrier substrates 81 and 91 can be enhanced while suppressing deterioration in production efficiency.

Next, as shown in FIG. 5(b), the protruding electrodes 89 for mounting the carrier substrate 81 on a motherboard are formed on the lands 84 provided on the back surface of the carrier substrate 81.

Figure 6A:
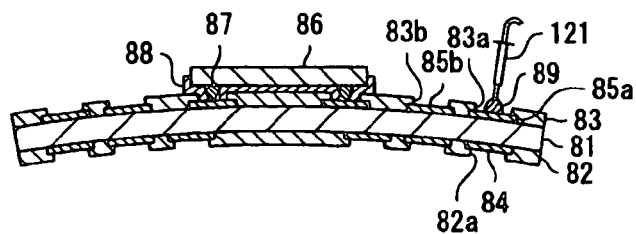
FIGS. 6A–C show sectional views illustrating a manufacturing method of a semiconductor device according to a fourth embodiment.
Figure 6B:
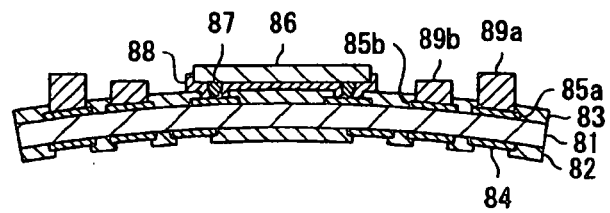
Figure 6C:
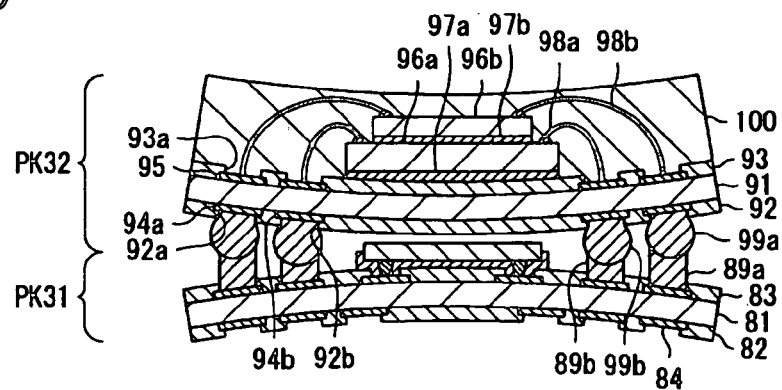

FIGS. 6A–C show cross-sectional views illustrating a manufacturing method of a semiconductor device according to a fourth embodiment of the present invention. In the fourth embodiment, by adjusting to-be-applied amount of the conductive pastes 89, the thickness of the conductive pastes 89a and 89b applied to the carrier substrate 81 are adjusted.

In FIG. 6, in case that the conductive pastes 89a and 89b are formed on the lands 85a and 85b of the carrier substrate 81, a dispenser 121 is used. The conductive pastes 89a and 89b are formed on the lands 85a and 85b of the carrier substrate 81 while adjusting the supplying amount of the conductive pastes 89 for the each of the lands 85a and 85b. This enables volumes of the protruding electrodes 101a and 101b to be changed corresponding to an interval between the carrier substrate 81 and the carrier substrate 91. Accordingly, even if the carrier substrates 81 and 91 warp, constrictions of the protruding electrodes 101a and 101b can be suppressed.

Figure 7:
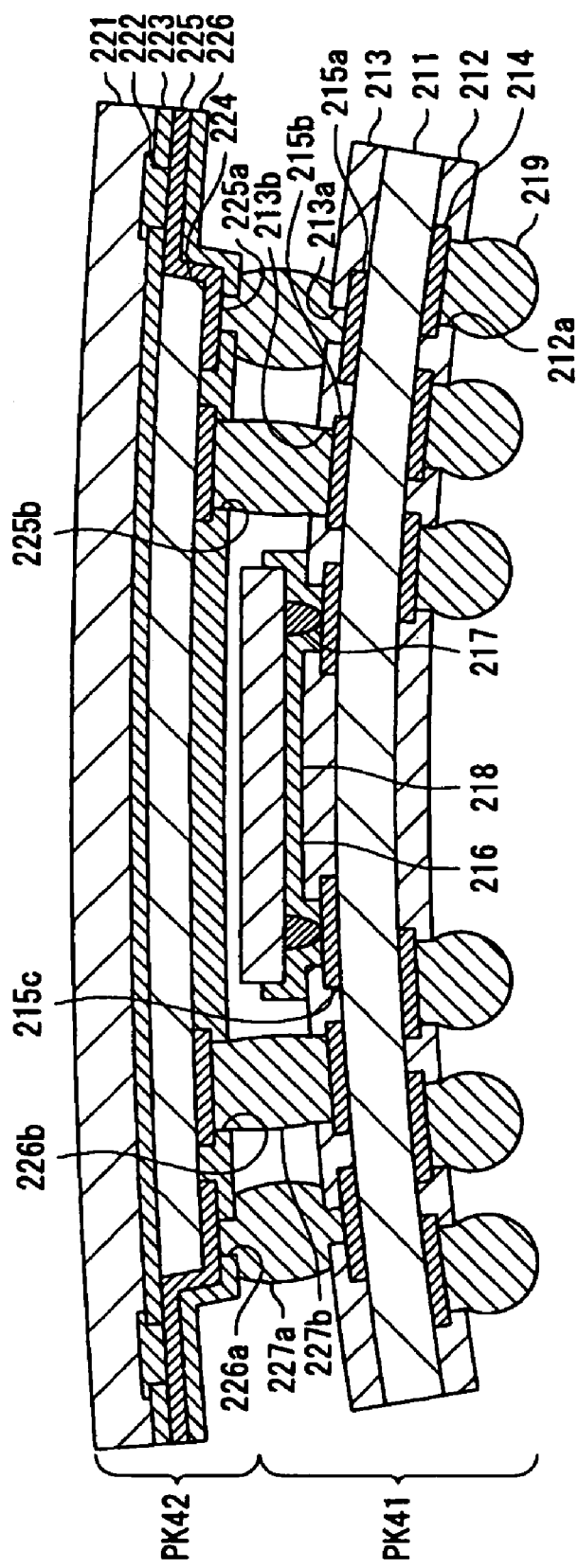
FIG. 7 shows a sectional view illustrating a constitution of a semiconductor device according to a fifth embodiment.

FIG. 7 shows a cross-sectional view illustrating a constitution of a semiconductor device according to a fifth embodiment of the present invention. In the fifth embodiment, opening diameters of openings 226a and 226b provided corresponding to protruding electrodes 227a and 227b of a W-CSP (Wafer-level Chip-Size Package) are changed. In FIG. 7, a carrier substrate 211 is provided in a semiconductor package PK41. On a back surface of the carrier substrate 211, lands 214 for arranging protruding electrodes 219 are provided. Furthermore, on the back surface of the carrier substrate 211 provided with the lands 214, an insulating layer 212 such as a solder resist is provided, and openings 212a for exposing surfaces of the lands 214 are provided in the insulating layer 212.

On the other hand, on a front surface of the carrier substrate 211, lands 215a and 215b for arranging protruding electrodes 229a and 229b are provided, respectively, and lands 215c for arranging protruding electrodes 217 are provided. Furthermore, on the front surface of the carrier substrate 211 provided with the lands 215a through 215c, an insulating layer 213 such as a solder resist is formed, and openings 213a through 213c for exposing surfaces of the lands 215a through 215c are provided, respectively, in the insulating layer 213.

Opening diameters of the openings 213a and 213b provided corresponding to the protruding electrodes 229a and 229b, respectively, can be set, for example, so as to be gradually decreased from a central portion toward an outer peripheral portion of the carrier substrate 211. On the carrier substrate 211, a semiconductor chip 216 is flip-chip mounted, and on the semiconductor chip 216, the protruding electrodes 217 for flip-chip-mounting are provided. The protruding electrodes 217 provided on the semiconductor chip 216 are ACF joined on the lands 215c via an anisotropic conductive film 218. On the lands 214 provided on the back surface of the carrier substrate 211, the protruding electrodes 219 for mounting the carrier substrate 211 on a motherboard are provided.

On the other hand, in a semiconductor package PK42, a semiconductor chip 221 is provided. On the semiconductor chip 221, electrode pads 222 are provided, and an insulating layer 223 are provided in such a manner so as to expose the electrode pads 222. On the semiconductor chip 221, a stress-relieving layer 224 is provided in such a manner so as to expose the electrode pads 222. On the electrode pads 222, re-routing wirings 225 is formed while extending on the stress-relieving layer 224, and on the stress-relieving layer 224, lands 225a and 225b for arranging the protruding electrodes 227a and 227b, respectively, are formed. Furthermore, on the re-routing wirings 225 and the lands 225a and 225b, a solder resist film 226 is formed, and openings 226a and 226b for exposing the lands 225a and 225b on the stress-relieving layer 224, respectively, are formed in the solder resist film 226.

Opening diameters of the openings 226a and 226b provided corresponding to the protruding electrodes 227a and 227b, respectively, can be set, for example, so as to be gradually decreased from a central portion toward an outer peripheral portion of the semiconductor chip 221. On the lands 225a and 225b exposed through the openings 226a and 226b, the protruding electrodes 227a and 227b are provided, respectively, for face-down-mounting the semiconductor chip 221 in such a manner that the semiconductor chip 221 is held above the semiconductor chip 216. The protruding electrodes 227a and 227b can be arranged in such a manner so as to avoid a mounting region of the semiconductor chip 216. For example, the protruding electrodes 227a and 227b can be arranged in a peripheral portion of the semiconductor chip 221.

It is assumed that a difference in coefficient of linear expansion between the carrier substrate 211 and the semiconductor chip 216 or the like causes, for example, the semiconductor package PK41 to warp downward, and a difference in coefficient of linear expansion between the semiconductor chip 221 and the stress-relieving layer 224 or the like also causes the semiconductor package PK 42 to warp downward and the semiconductor package PK41 to warp more largely than the semiconductor package PK42.

For example, in a state that the semiconductor package PK41 warps downward, the semiconductor package PK42 also warps downward, and the semiconductor package PK41 warps more largely than the semiconductor package PK42, by joining the protruding electrodes 227a and 227b with the lands 215a and 215b provided on the carrier substrate 211, respectively, the semiconductor chip 221 can be mounted on the carrier substrate 211. Although in the above-described example, the semiconductor package PK41 warps more largely than the semiconductor package PK42, the semiconductor package 42 may warp more largely than the semiconductor package 41.

Thereby, the W-CSP can be stacked on the carrier substrate 211, on which the semiconductor chip 216 is flip-chip mounted, and the semiconductor chip 221 is three-dimensionally mounted above the semiconductor chip 216 without interposing any carrier substrate between the semiconductor chips 216 and 221 even in case that the semiconductor chips 216 and 221 are different in type or size. Furthermore, expansion of the protruding electrodes 227a and 227b can be suppressed from both sides of the carrier substrate 211 and the semiconductor chip 221.

Therefore, even in case that the semiconductor package PK41 and PK42 warp, constrictions of the protruding electrodes 227a and 227b can be suppressed while suppressing an increase in height when stacking the semiconductor chips 216 and 221, so that space can be saved when mounting the semiconductor chips 216 and 221 while suppressing deterioration of connection reliability in the three-dimensional mounting.

Although in the above-described embodiment, a case that the opening diameters of the openings 226a and 226b are gradually decreased from the central portion toward the outer peripheral portion of the semiconductor chip 221 is described, in case that the semiconductor package PK42 warps downward, the opening diameters of the openings 226a and 226b may be set so as to be gradually increased from the central portion toward the outer peripheral portion of the semiconductor chip 221.

Furthermore, the above-described semiconductor devices and electronic devices can be applied to electronic apparatuses such as, for example, liquid crystal display device, cellular phone, personal digital assistant, video camera, digital camera, MD (Mini Disc) player or the like. And reliability of these electronic apparatuses can be enhanced while realizing downsizing and weight savings in the electronic apparatuses. Furthermore, although in the above-described embodiments, the methods of mounting the semiconductor chips or the semiconductor packages are described as examples, the present invention is not limited to the methods of mounting the semiconductor chips or the semiconductor packages. For example, ceramic elements such as a surface acoustic wave (SAW) element, optical elements such as an optical modular and optical switch, various sensors such as a magnetic sensor and bio-sensor or the like may be mounted.

What is claimed is:

1. A semiconductor device, comprising:
   a first semiconductor package including a first curved substrate defining a first concave surface and a first convex surface and a plurality of first joining points, the first joining points are formed on the first convex surface and include different areas for protruding electrodes;
   a second semiconductor package including a second curved substrate defining a second concave surface and a second convex surface and a plurality of second joining point, the second joining points are formed on the second convex surface and include different areas for the protruding electrodes and are arranged so as to be opposed to the respective first joining points; and
   a semiconductor chip positioned between the first convex surface of the first curved substrate and the second convex surface of the second curved substrate and flip-chip mounted to the first convex surface of the first curved substrate.

2. The semiconductor device according to claim 1, wherein the areas of each of the joining points are opening areas of an insulating layer on lands with which the protruding electrodes are joined.

3. The semiconductor device according to claim 1, wherein the areas of each of the joining points are gradually changed from a central portion toward an outer peripheral portion of the semiconductor package.

4. The semiconductor device according to claim 1, wherein as an interval between the first semiconductor package and the second semiconductor package becomes larger, the areas of the first joining points and the areas of the second joining points gradually become smaller.

5. The semiconductor device according to claim 1, wherein volumes of the protruding electrodes connected to each of the plurality of joining points are substantially the same.

6. A semiconductor device, comprising:
   a first semiconductor package including a first curved substrate defining a first concave surface and a first convex surface;
   a second semiconductor package including a second curved substrate defining a second concave surface and a second convex surface, the second semiconductor package stacked on the first semiconductor package through a plurality of protruding electrodes including different volumes such that the first convex surface opposes the second convex surface; and a first semiconductor chip positioned between the first convex surface of the first curved substrate and the second convex surface of the second curved substrate and flip-chip mounted to the first convex surface of the first curved substrate.

7. The semiconductor device according to claim 6, wherein the volumes of the protruding electrodes are gradually changed from a central portion toward an outer peripheral portion of the semiconductor packages.

8. The semiconductor device according to claim 7, wherein as an interval between the first semiconductor package and the second semiconductor package becomes larger, the volumes of the protruding electrodes gradually become larger.

9. The semiconductor device according to claim 6, wherein each of the protruding electrodes has different amounts of conductive paste.

10. The semiconductor device according to claim 1, further comprising a second semiconductor chip mounted on the second curved substrate and a sealing material sealing the second semiconductor chip to the second curved substrate.

11. The semiconductor device according to claim 10, wherein the first semiconductor package comprises a ball grid array with the first semiconductor chip, flip-chip mounted on the first convex surface of the first curved substrate, and the second semiconductor package comprises any of a ball grid array and a chip-size package, in which the second semiconductor chip is mounted on the second concave surface of the second curved substrate is mold-sealed.

12. An electronic device, comprising:

a first curved substrate defining a first convex surface and a first concave surface and a plurality of first joining points disposed on the first convex surface, the first joining points including different areas for protruding electrodes;

a first electronic component, flip-chip mounted on the first convex surface of the first curved substrate;

a second curved substrate defining a second convex surface and a second concave surface and a plurality of second joining points disposed on the second convex surface, the second joining points including different areas for the protruding electrodes and being arranged so as to be opposed to the first joining points;

a second electronic component, mounted on the second concave surface of the second curved substrate; and a sealing material sealing the second electronic component.

13. An electronic device, comprising:

a first curved substrate defining a first convex surface and a first concave surface;

a first electronic component, flip-chip mounted on the first convex surface of the first curved substrate;

a second curved substrate defining a second convex surface and a second concave surface, the second curved substrate mounted on the first curved substrate through a plurality of protruding electrodes including different volumes, so as to be held above the first electronic component with the first convex surface opposing the second convex surface;

a second electronic component, mounted on the second concave surface of the second curved substrate; and a sealing material sealing the second electronic component.

14. The electronic device of claim 12, further comprising a motherboard, on which the first semiconductor package is mounted.

* * * * *

UNITED STATES PATENT AND TRADEMARK OFFICE
CERTIFICATE OF CORRECTION

| | | |
|---|---|---|
| PATENT NO. | : 7,091,619 B2 | Page 1 of 1 |
| APPLICATION NO. | : 10/805499 | |
| DATED | : August 15, 2006 | |
| INVENTOR(S) | : Akiyoshi Aoyagi | |

It is certified that error appears in the above-identified patent and that said Letters Patent is hereby corrected as shown below:

Title Page, Item No. (56) References Cited      Reference not cited on patent:
Insert --6,120,855    9/2000   Call et al.--

Signed and Sealed this

Seventeenth Day of April, 2007

JON W. DUDAS
*Director of the United States Patent and Trademark Office*